United States Patent
Helmick et al.

(10) Patent No.: US 11,170,869 B1
(45) Date of Patent: Nov. 9, 2021

(54) DUAL DATA PROTECTION IN STORAGE DEVICES

(71) Applicant: Western Digital Technologies, Inc., San Jose, CA (US)

(72) Inventors: Daniel L. Helmick, Broomfield, CO (US); Gerrit Jan Hemink, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/893,204

(22) Filed: Jun. 4, 2020

(51) Int. Cl.
| G11C 29/00 | (2006.01) |
| G11C 29/42 | (2006.01) |
| G11C 29/44 | (2006.01) |
| H03M 13/11 | (2006.01) |
| G11C 11/16 | (2006.01) |

(52) U.S. Cl.
CPC .......... *G11C 29/42* (2013.01); *G11C 11/1673* (2013.01); *G11C 11/1677* (2013.01); *G11C 29/44* (2013.01); *H03M 13/1145* (2013.01)

(58) Field of Classification Search
CPC ..... G11C 29/42; G11C 29/44; H03M 13/1145
See application file for complete search history.

(56) References Cited

U.S. PATENT DOCUMENTS

| 9,817,714 | B2 | 11/2017 | Halbert et al. |
| 10,073,731 | B2 | 9/2018 | Motwani et al. |
| 2017/0185463 | A1* | 6/2017 | Kim ................. G06F 11/076 |
| 2018/0004601 | A1 | 1/2018 | Lee et al. |
| 2018/0024878 | A1 | 1/2018 | Das et al. |
| 2019/0012230 | A1 | 1/2019 | Chung et al. |
| 2019/0042358 | A1 | 2/2019 | Criss et al. |
| 2020/0192754 | A1* | 6/2020 | Cho ................. G11C 29/52 |
| 2020/0379915 | A1* | 12/2020 | Moertl ............... G06F 12/0246 |

OTHER PUBLICATIONS

Schroeder et al. "DRAM Errors in the Wild: A Large-Scale Field Study," SIGMETRICS/Performance '09, Jun. 15-19, 2019, Seattle, WA, US, 12 pages.

* cited by examiner

*Primary Examiner* — Uyen Smet
(74) *Attorney, Agent, or Firm* — Patterson & Sheridan, LLP; Steven H. Versteeg (57) ABSTRACT

The present disclosure generally relates to storage devices, such as solid state drives. A storage device comprises a controller comprising a controller error correction code (ECC) engine and a storage unit comprising a plurality of dies. Each of the dies comprise a die ECC engine. When user data is received, the controller ECC engine generates first ECC/error detection code (EDC) data. The user data and the first ECC/EDC data is sent to a die for storage as a code word. The die ECC engine generates second ECC/EDC data for the code word in granular portions. The second ECC/EDC data is used to correct bit errors in one or more code words up to a threshold value. When the number of bit errors exceeds the threshold value, the failed code words are sent to the controller ECC engine for correction.

18 Claims, 6 Drawing Sheets

DUAL DATA PROTECTION IN STORAGE DEVICES

BACKGROUND OF THE DISCLOSURE

Field of the Disclosure

Embodiments of the present disclosure generally relate to storage devices, such as solid state drive (SSDs).

Description of the Related Art

Storage devices, such as SSDs, may be used in computers in applications where relatively low latency and high capacity storage are desired. For example, SSDs may exhibit lower latency, particularly for random reads and writes, than hard disk drives (HDDs). Typically, a controller of the SSD receives a command to read or write data from a host device to a storage unit. The data is read and written to one or more storage blocks of one or more dies in the storage unit.

When writing host data to the one or more storage blocks in the storage unit, the controller also generates and writes data protection information, host or controller metadata, error detection codes (EDC) (e.g., cyclic redundancy check (CRC), an expected value to check for correct decoding (e.g., a sentinel value), and/or host LBA), and error correction codes (ECC) to the storage unit. If an unacceptable amount of bit errors accumulates within the data while in storage or transmission to/from storage media, the data written to the storage unit can be recovered using the EDC and ECC. However, the storage device is limited as to how many bit errors can be corrected or recovered using the EDC and ECC. Thus, when too many bit errors accumulate in the data, the data may be deemed uncorrectable, resulting in the data being lost or marked as corrupted.

Thus, what is needed is a new storage device and method of protecting data from errors.

SUMMARY OF THE DISCLOSURE

The present disclosure generally relates to storage devices, such as solid state drives. A storage device comprises a controller comprising a controller error correction code (ECC) engine and a storage unit comprising a plurality of dies. Each of the dies comprise a die ECC engine. When user data is received, the controller ECC engine generates first ECC/error detection code (EDC) data. The user data and the first ECC/EDC data is sent to a die for storage as a code word. The die ECC engine generates second ECC/EDC data for the code word in granular portions. The second ECC/EDC data is used to correct bit errors in one or more code words up to a threshold value. When the number of bit errors exceeds the threshold value, the failed code words are sent to the controller ECC engine for correction.

In one embodiment, a storage unit comprising a controller coupled to the media unit. The controller comprises a controller ECC engine, wherein the controller ECC engine is configured to generate first ECC data for user data. The storage unit further comprises a media unit comprising a plurality of dies. Each of the dies comprises a die ECC engine, wherein each of the dies are configured to receive and store the user data and the first ECC data from the controller, and wherein each of the die ECC engines are individually configured to generate second ECC data for the user data.

In another embodiment, a storage device comprising a controller coupled to the media unit. The controller comprises a controller ECC engine, wherein the controller ECC engine is configured to generate first ECC and EDC data for user data and correct a first amount of errors within the user data. The storage device further comprises a media unit comprising a plurality of dies. Each of the dies comprises a die ECC engine, wherein each of the die ECC engines are individually configured to receive the first ECC and EDC data and the user data from the controller as one or more of code words, generate second ECC and EDC data for the one or more code words, store the second ECC and EDC data and the one or more code words, and correct a second amount of errors within the user data, where the second amount of errors being less than the first amount of errors.

In another embodiment, a method of operating a storage device comprises receiving, at a controller of the storage device, user data, generating first ECC data for the user data in a controller ECC of the controller, and sending the user data and the first ECC data as a plurality of code words to one or more dies of a plurality of dies of the storage device, where each of the plurality of the dies comprises a die ECC engine. The method of operating a storage device further comprises generating, in the die ECC engines of the one or more dies, second ECC data for the plurality of code words, correcting one or more code words of the plurality of code words having a first amount of errors using the die ECC engine of the first die to form one or more corrected code words free of errors, and sending the corrected code words, a first uncorrected code word, a second uncorrected code word, and the second ECC data from the one or more dies to the controller, where the first and second uncorrected code words have a second amount of errors. The method of operating a storage device also comprises generating a speculative code word and correcting the first and second uncorrected code words using the speculative code word and the corrected code words.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to storage devices, such as solid state drives. A storage device comprises a controller comprising a controller error correction code (ECC) engine and a storage unit comprising a plurality of dies. Each of the dies comprise a die ECC engine. When user data is received, the controller ECC engine generates first ECC/error detection code (EDC) data. The user data and the first ECC/EDC data is sent to a die for storage as a code word. The die ECC engine generates second ECC/EDC data for the code word in granular portions. The second ECC/EDC data is used to correct bit errors in one or more code words up to a threshold value. When the number of bit errors exceeds the threshold value, the failed code words are sent to the controller ECC engine for correction.

Figure 1:
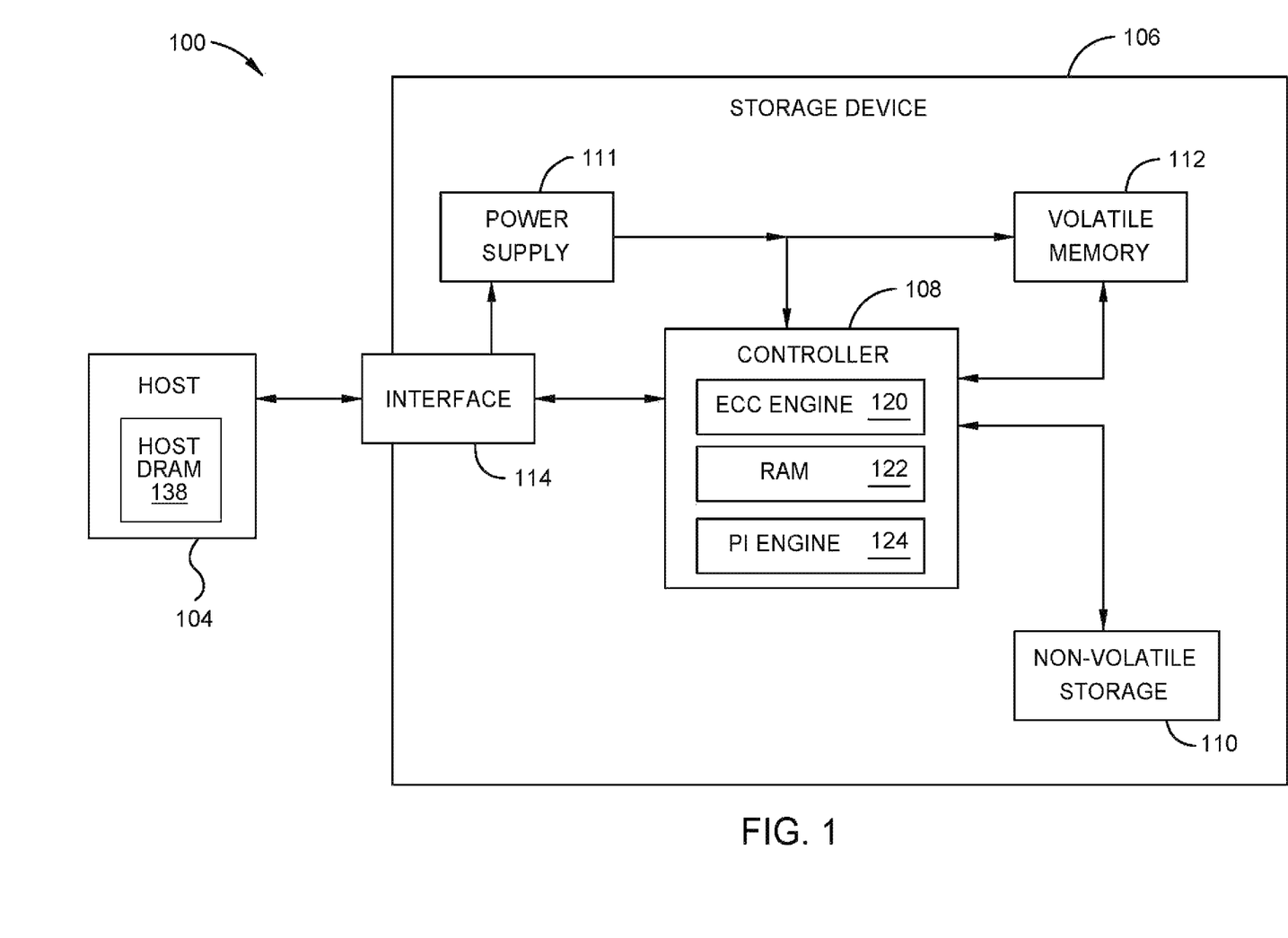
FIG. 1 is a schematic block diagram illustrating a storage system, according to one embodiment.

FIG. 1 is a schematic block diagram illustrating a storage system 100 in which storage device 106 may function as a storage device for a host device 104, in accordance with one or more techniques of this disclosure. For instance, the host device 104 may utilize a storage unit 110, such as non-volatile memory (NVM), included in storage device 106 to store and retrieve data. The storage unit 110 may be any type of non-volatile memory, such as MRAM, NAND, NOR, or HDD, for example. In the following descriptions, the storage unit 110 is referenced as a non-volatile memory (NVM) 110 for simplification and exemplary purposes. The host device 104 comprises a host DRAM 138. In some examples, the storage system 100 may include a plurality of storage devices, such as the storage device 106, which may operate as a storage array. For instance, the storage system 100 may include a plurality of storages devices 106 configured as a redundant array of inexpensive/independent disks (RAID) that collectively function as a mass storage device for the host device 104.

The storage system 100 includes a host device 104 which may store and/or retrieve data to and/or from one or more storage devices, such as the storage device 106. As illustrated in FIG. 1, the host device 104 may communicate with the storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

The storage device 106 includes a controller 108, NVM 110, a power supply 111, a first random-access memory (RAM) or volatile memory 112, such as a dynamic random-access memory (DRAM), a protection information (PI) engine 124, an ECC engine 120, and an interface 114. The controller 108 may comprise a second RAM or volatile memory 122, such as a static random-access memory (SRAM). In the following descriptions, a first RAM or volatile memory 112 is referenced to as DRAM memory and a second RAM or volatile memory 122 is referenced as SRAM memory for simplification and exemplary purposes. In some examples, the storage device 106 may include additional components not shown in FIG. 1 for sake of clarity. For example, the storage device 106 may include a printed circuit board (PCB) to which components of the storage device 106 are mechanically attached and which includes electrically conductive traces that electrically interconnect components of the storage device 106, or the like. In some examples, the physical dimensions and connector configurations of the storage device 106 may conform to one or more standard form factors. Some example standard form factors include, but are not limited to, 2.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the storage device 106 may be directly coupled (e.g., directly soldered) to a motherboard of the host device 104.

The interface 114 of the storage device 106 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, PCIe, non-volatile memory express (NVMe), OpenCAPI, GenZ, Cache Coherent Interface Accelerator (CCIX), Compute Express Link (CXL), Open Channel SSD (OCSSD), or the like. The electrical connection of the interface 114 (e.g., the data bus, the control bus, or both) is electrically connected to the controller 108, providing electrical connection between the host device 104 and the controller 108, allowing data to be exchanged between the host device 104 and the controller 108. In some examples, the electrical connection of the interface 114 may also permit the storage device 106 to receive power from the host device 104. For example, as illustrated in FIG. 1, the power supply 111 may receive power from the host device 104 via the interface 114.

The storage device 106 includes NVM 110, which may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit of NVM 110 may receive a message from the controller 108 that instructs the memory unit to retrieve data. In some examples, each of the memory units may be referred to as a die. In some examples, a single physical chip may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit of NVM 110 may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. Flash memory devices may include NAND or NOR based flash memory devices, and may store data based on a charge contained in a floating gate of a transistor for each flash memory cell. In NAND flash memory devices, the flash memory device may be divided into a plurality of blocks which may be divided into a plurality of pages. Each block of the plurality of blocks within a particular memory device may include a plurality of NAND cells. Rows of NAND cells may be electrically connected using a word line to define a page of a plurality of pages. Respective cells in each of the plurality of pages may be electrically connected to respective bit lines. Furthermore, NAND flash memory devices may be 2D or 3D devices, and may be single level cell (SLC), multi-level cell (MLC), triple level cell (TLC), or quad level cell (QLC). The controller 108 may write data to and read data from NAND flash memory devices at the page level and erase data from NAND flash memory devices at the block level.

The NVM 110 may also comprise optional second ECC engines in each of the plurality of dies. The optional second ECC engines of each die may be located in either the logic of the media die, such as Circuits Under Array and/or Circuit Bonded Array, the co-packaged logic die with the media dies, such as Through Silicon Vias (TSV) and/or wire bonded, or an interior code word implemented within the controller 108.

The storage device 106 includes a power supply 111, which may provide power to one or more components of the storage device 106. When operating in a standard mode, the power supply 111 may provide power to the one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The storage device 106 also includes volatile memory 112, which may be used by controller 108 to store information. Volatile memory 112 may be comprised of one or more volatile memory devices. In some examples, the controller 108 may use volatile memory 112 as a cache. For instance, the controller 108 may store cached information in volatile memory 112 until cached information is written to the NVM 110. Examples of volatile memory 112 include, but are not limited to, RAM, DRAM, SRAM, and synchronous dynamic RAM (SDRAM (e.g., DDR1, DDR2, DDR3, DDR3L, LPDDR3, DDR4, LPDDR4, DDR5, LPDDR5, and the like)). As illustrated in FIG. 1, volatile memory may consume power received from the power supply 111.

The various types of volatile memories may be used with different access properties. For example, DRAM may be arranged for longer burst accesses to allow for improved bandwidth (BW) of the same access bus. Alternatively, DRAM may be used with smaller accesses such that random small accesses may have better latency. The controller 108 comprises additional optional RAM 122, such as SRAM and/or embedded MRAM. Embedded MRAM is another alternative memory that may be used in another embodiment. Similarly, the access to the MRAM can be optimized for different design purposes, but the quantity of embedded MRAM in the SSD controller may be cost sensitive. Therefore, the choice of how much data and which data goes into the premium non-volatile memory and premium volatile memory will subject to system tradeoffs.

The storage device 106 includes a controller 108, which may manage one or more operations of the storage device 106. For instance, the controller 108 may manage the reading of data from and/or the writing of data to the NVM 110 via a toggle mode (TM) bus. In some embodiments, when the storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic to the NVM 110. In some embodiments, when the storage device 106 receives a write command from the host device 104, the controller 108 temporarily stores the data associated with the write command in the internal memory or buffer, such as RAM 122, before sending the data to the NVM 110. RAM 122 may comprise data in flight, such as data not yet written to the NVM 110 or data in a size less than the minimum write size. Once the user data aggregates to a minimum write size in the RAM 122, the controller 108 may write the data to the relevant location in the NVM 110. The controller 108 further comprises an error correction code (ECC) engine 120 to aid in the quality control of data written to the NVM 110.

The SRAM device and the DRAM device each individually comprises one or more dies. Each of the one or more dies comprises one or more ranks which is comprised of one or more banks. The banks are composed of rows and pages. The SRAM in the controller 108 may be logically or physical separated into different SRAM areas or regions (not shown) for use by the controller 108. Similarly, the DRAM may be logically or physical separated into different DRAM areas or regions (not shown) for use by the controller 108. The MRAM inside of the controller 108 may be logically or physical separated into different MRAM areas or regions (not shown). External attachments of MRAM often have a vendor specific structure and access not covered here.

In some embodiments, the storage device 106 may comprise a scrambler engine or security engine (not shown) disposed between the controller 108 and the NVM 110. In another embodiment, the storage device 106 may comprise a scrambler engine or security engine (not shown) disposed between the controller 108 and the interface 114. Depending on the implementation of the scrambler and the security engine, the EDC and ECC may be impacted. One embodiment may be to scramble the Host LBA (HLBA) and data together. If the EDC were using the HLBA as a sentinel value to confirm correct reading of the data, then constraints may be placed on the scrambler or security engine implementation. For example, the scrambling and security may need to be removed to correctly compare the HLBA to its expected value. Alternatively, the HLBA may be concatenated onto the data after the scrambler and/or security engine have been applied to the data, which may be easier to implement an EDC check. However, the HLBA may end up being a security risk depending on the threats the storage device is attempting to protect against. Other factors such as a raw bit error rate (RBER) increase may enter into the decision on data protection measures. In some embodiments, the scrambler may protect against RBER increases due to preferred bit distributions in the NVM for data storage. Other alternative implementations exist, but intelligent ordering and application of scrambler and security engine are expected to be coordinated with the EDC and ECC development.

Figure 2:
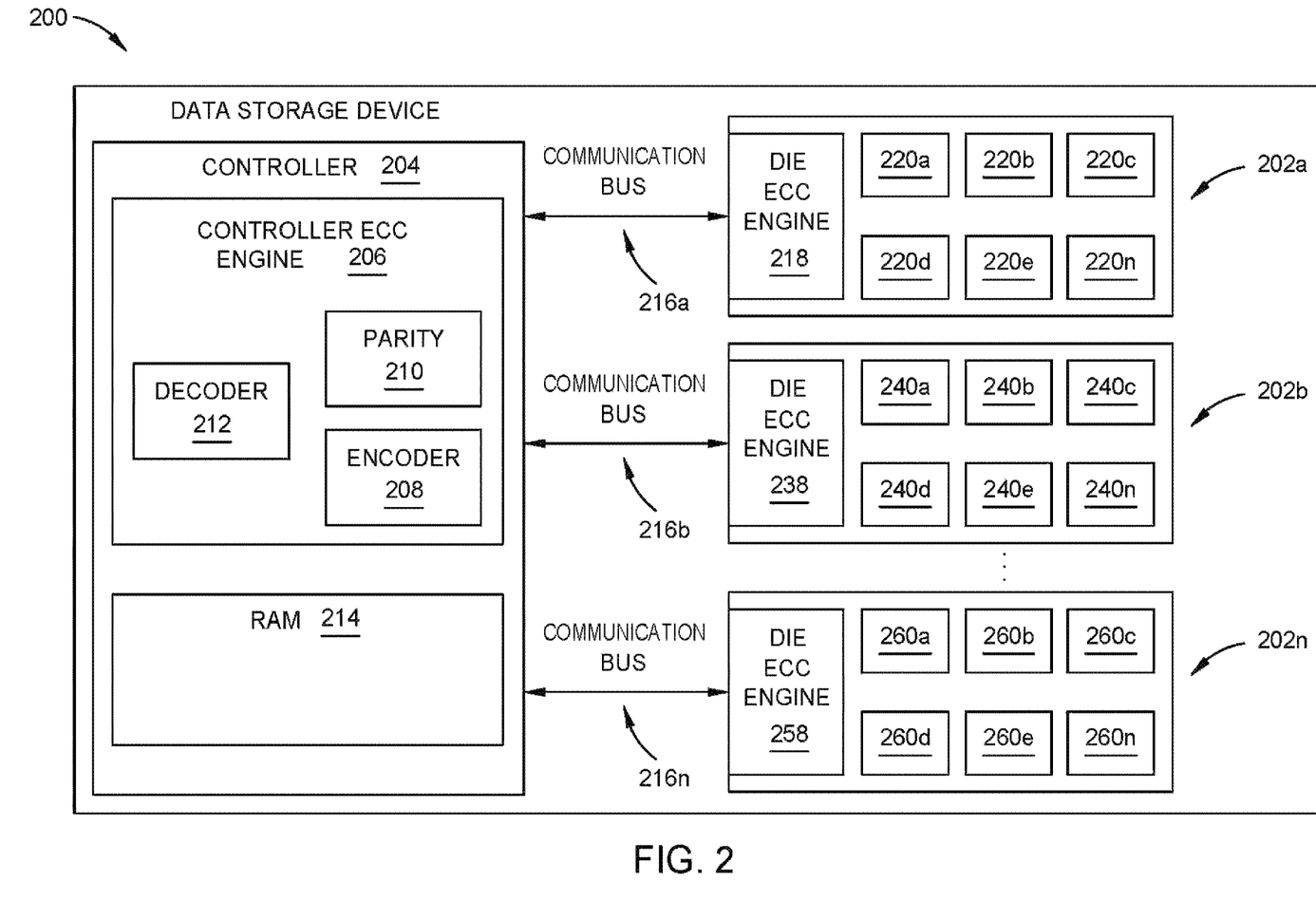
FIG. 2 is a schematic block diagram illustrating a data storage device, according to one embodiment.

FIG. 2 is a schematic block diagram illustrating a data storage device 200, according to one embodiment. Aspects of the data storage device 200 may be similar to the data storage device 106 of FIG. 1. The data storage device 200 comprises a controller 204 and one or more dies 202a-202n (collectively referred to as dies 202) for storing data. The one or more dies 202a-202n may be MRAM, NVM, or volatile memory dies. The controller 204 writes to and reads from the one or more dies 202a-202n via one or more communication buses 216a-216n (collectively referred to as communication buses 216). While one die 202a-202n is shown coupled to each communication bus 216a-216n, a plurality of dies 202 may be coupled to each communication bus 216. Each die comprises a plurality of storage blocks, such as erase blocks or banks. For example, the first die 202a comprises a plurality of storage blocks 220a-220n, the second die 202b comprises a plurality of storage blocks 240a-240n, and the $n^{th}$ die 202n comprises a plurality of storage blocks 260a-260n.

The controller 204 comprises a controller ECC engine 206 and internal RAM 214. In one embodiment, the RAM 214 is SRAM and/or DRAM. In another embodiment, the RAM 214 is SRAM and/or MRAM. The controller 204 is configured to receive one or more commands to write user data and temporarily store the user data in the RAM 214 until the user data aggregates to a minimum write size, such as about 16 KiB of user data. The controller ECC engine 206 comprises a decode engine 212, which may be referred to as a decoder 212, and an encode engine 208, which may be referred to as an encoder 208, coupled to a parity engine 210. In some embodiments, the encoder 208 and the parity engine 210 are coupled. In other embodiments, the encoder 208 and the parity engine 210 are decoupled.

In at least one implementation, the decoder 212 uses the error correction information generated by the encoder 208 and/or the parity engine 210 for an error correcting code to correct errors in data (e.g., ECC data, redundant, and/or encoded bits) stored in the dies 202. In various embodiments, an error correcting code may be one of various types of error correcting codes, such as a block code, a convolution code, a Bose-Chaudhuri-Hocquenghem (BCH) code, a low-density parity check (LDPC) code, a Hamming code, a Reed-Solomon (RS) code, a turbo code, or the like. In some embodiments, the error correcting code may be a systematic error correcting code. Systematic error correcting codes generate the EDC and ECC portions of the code word (CW) without altering the original data to be protected. The ECC and EDC portions of the CW may be identified separate from the original data being stored.

A code word comprises user data, optional host metadata, optional controller metadata, optional various EDC, and ECC. The partitioning of the code word and the various parts can vary widely and includes grouping the parts all together or having various segments of data, EDC, and ECC interlaced, such as in non-systematic ECC CWs. The code words may have a layered structure of interior and exterior relationships between the parts. For example, the code word at the controller level may have a structure where the first half of the code word includes half of the user data (e.g., ½ data), including optional host metadata and optional controller data, followed by the first interior EDC (e.g., interior EDC 0), where the first interior EDC is followed by the first interior ECC (e.g., interior ECC 0). The second half of the code word at the controller level includes the remaining half of the user data (e.g., ½ data), including optional host metadata and optional controller metadata, followed by the second interior EDC (e.g., interior ECC 1), where the second interior EDC is followed by the second interior ECC (e.g., interior ECC 1). The outer ECC is attached to the tail of the second half of the code word, where the order of the components of the code word is as follows: the first half of the code word, the second half of the code word, and the exterior ECC. Furthermore, the configuration of the components of the code word may be in any order, such that the code word is in the following order: The second half of the code word, the first half of the code word, and the exterior ECC. In the descriptions herein, the controller ECC data and the controller EDC data may be referred to as first ECC and first EDC data, respectively, for exemplary purposes.

The code word or data may further comprise protection information (PI) for the user data generated or checked by the PI engine 124 in addition to the user data and the metadata. PI may be of any variety standardized for storage and commonly used in SSDs and/or HDD interfaces. Data Integrity Field (DIF) and Data Integrity Extension (DIX) are common implementations of PI. Moreover, there are additional types standardized across the various interfaces that may be used, as well as a vendor specific implementation.

The error detection code (EDC) may be generated and written with the ECC generated by the encoder 208 on the data written to the one or more dies 202. Examples of EDCs may include sentinel values, logical addresses, cyclical redundancy codes (CRC), RS check matrix constraints, or other ECC miscorrection checks that follows the ECC decodes. The miscorrection check detects if the ECC corrected to an invalid result, and the EDC may detect for erroneous code words. Thus, the controller encoder 208 may be an ECC and EDC encoder 208, and the controller decoder 212 may be an ECC and EDC decoder 212. The ECC/EDC encoder, ECC/EDC decoder, and parity engine may be used to reconstruct failed code words.

The one or more dies 202a-202n each comprise a die ECC engine 218, 238, 258. In one embodiment, the die ECC engines 218, 238, 258 may be located in the logic of the NVM die, such as Circuits Under Array and/or Circuit Bonded Array. In another embodiment, the die ECC engines 218, 238, 258 may be located in the co-packaged logic die with the NVM dies, such as Through Silicon Vias (TSV) and/or wire bonded logic die. In yet another embodiment, the die ECC engines 218, 238, 258 may be located in an interior code word implemented within the controller 108. The die ECC engines 218, 238, 258 generate ECC/EDC data to encode die ECC and EDC information with the data written to each die. The die ECC engines 218, 238, 258 further decode the die ECC/EDC information. The die ECC engines 218, 238, 258 are configured to send the ECC/EDC information to the controller ECC engine 206 for error correction purposes, as discussed further below. In the descriptions herein, the die ECC data and the die EDC data may be referred to as second ECC data and second EDC data, respectively, for exemplary purposes.

In some embodiments, the parity engine 210 may implement data protections across larger spans of the NVM. The parity engine 210 may exclusive or (XOR) the data from multiple dies together and store the resulting XOR data on a different die. The XOR data may provide mitigation and protection against die and plane failures. Furthermore, the XOR data may provide a secondary option to recover data, such as when the data losses exceed the controller capabilities of the first ECC data.

The controller ECC engine 206 encodes first ECC data and/or first EDC data to the user data received, and sends the user data, first ECC data, and first EDC data to a die 202 as a code word over a communication bus 216. Likewise, each die ECC engine 218, 238, and 258 encode second ECC data and/or second EDC data to sections of each code word received, and writes the code word, ECC data, and EDC data to one or more blocks 220, 240, 260. The second ECC data and the second EDC data are quality control codes over each granular section of a code word, whereas the first ECC data and the first EDC are quality control codes over the entire code word.

In one embodiment, each code word comprises about 16 KiB of user data and each granular section comprise about 4 KiB of user data, such that there are four granular sections in each code word. Because the second ECC data is for a smaller area, the number of errors, such as bit errors, that the second ECC data can correct may be less than the number of errors that the first ECC data can correct. If the number of errors of a code word exceeds the number errors that the second ECC data can correct, a die ECC engine reports back to the controller 204 that the second ECC data has failed. The data is copied from the relevant die 202 to the controller ECC engine 206 so that the controller ECC engine 206 can correct the code word using the first ECC and first EDC data.

Figure 3:
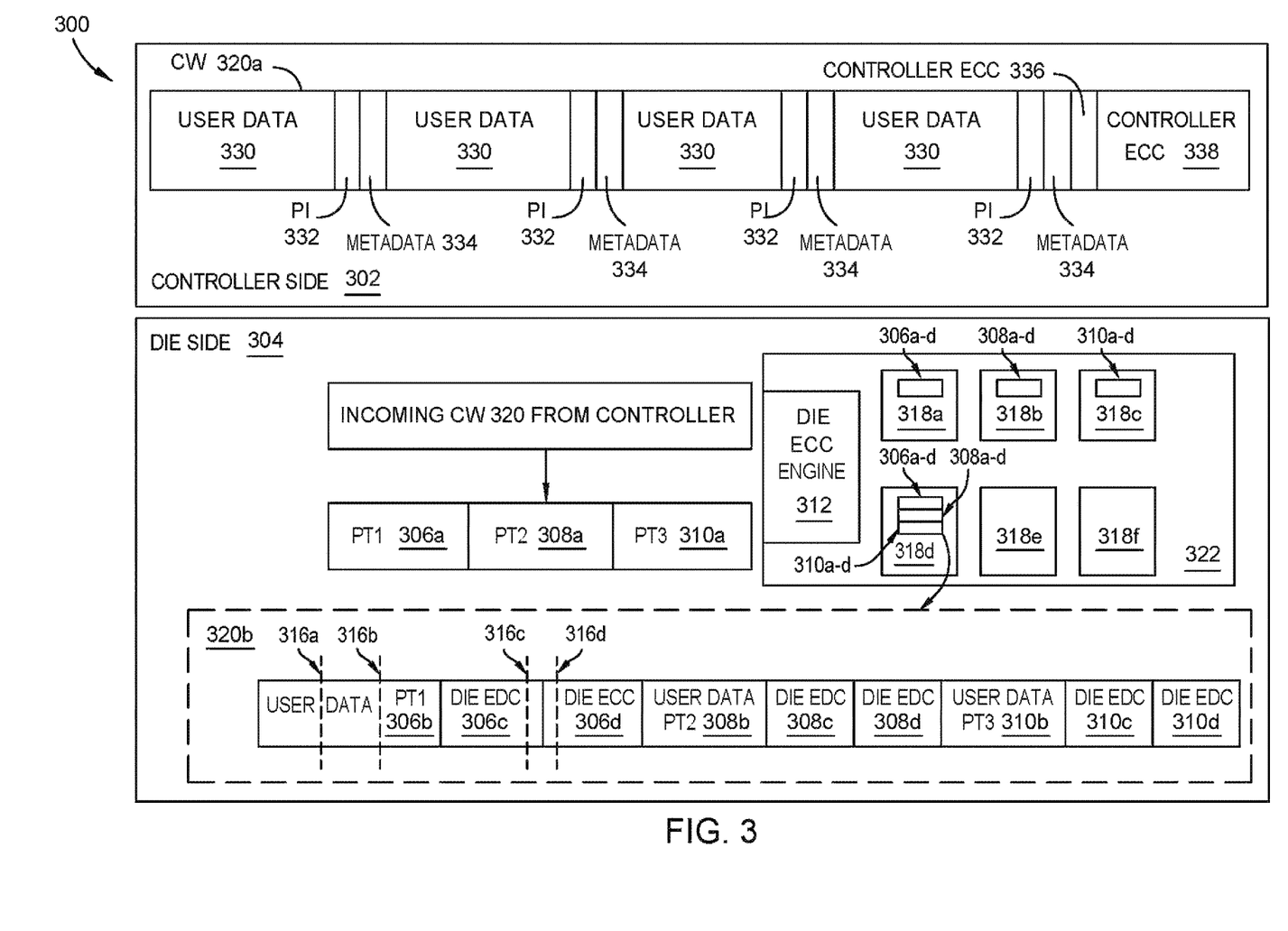
FIG. 3 is a schematic block diagram illustrating a code word from the perspective of a controller and of a die, according to one embodiment.

FIG. 3 is a schematic block diagram illustrating a code word from the controller perspective and from a die perspective, according to one embodiment. The controller may be the controller 108 of FIG. 1 or the controller 204 of FIG. 2. The die 322 may be a die 202 of FIG. 2. Reference may be made to elements of FIG. 2 for description purposes. The code word 320a in the controller side perspective 302 is comprised of user data 330, PI data 332, metadata 334, controller or first EDC data 336, and controller or first ECC data 338. The controller or first EDC data 336 and the controller or first ECC data 338 are generated by the controller ECC engine, such as the controller ECC engine 206 of FIG. 2, when the user data 330 is received by the controller 204 from a host device, such as the host device 104 of FIG. 1. The controller or first EDC data 336 size may be about 8 bytes of error detection code and the controller or first ECC data 338 size may be about 128 bytes of error correction code. In the current embodiment, the code word 320a may be about 16 KiB plus the protection information (PI) 332 size, the metadata 334 size, the controller or first EDC data 336 size, and the controller or first ECC data 338 size; however, other code word sizes may be applicable.

In FIG. 3, the die side perspective 304 illustrates the code word 320a after the controller 204 has programmed the code word to die 322 of a MRAM storage unit or a NVM storage unit via a communication bus, such as the communication bus 216a of FIG. 2. The code word 320a is partitioned into segments by the die ECC engine 312, such as pt1 306a, pt2 308a, and pt3 310a. The number of segments may be more or less, such as about 8 segments or 32 segments. Each segment may have an equal size. When the code word 320a is written to a relevant die 322, or prior to writing the code word 320a to the die 322, the die ECC engine 312 encodes second ECC data 306d, 308d, 310d and second EDC data 306c, 308c, 310c to each segment, such that each segment comprises second ECC data 306d, 308d, 310d and second EDC data 306c, 308c, 310c.

In one embodiment, the code word segments may be programmed to more than one storage block 318 of the die 322, such as pt1 306a-306d in storage block 318a, pt2 308a-308d in storage block 318b, and pt3 310a-310d in storage block 318c. In another embodiment, the code word segments 306a-306d, 308a-308d, 310a-310d may be programmed to the same storage block 318, such as storage block 318d. In another embodiment, more than one segment may be programmed to one or more storage block. Though the data segments may be programmed to different storage blocks, the controller 204 may register the location of the data and logically arrange the code word 320a in order, such as in the order of pt1 306a, pt2 308a, and pt3 310a.

The code word 320b illustrates the aggregated segments of the original code word 320a, such that the code word 320b comprises the same data as the code word 320a plus a plurality of second ECC data 306d, 308d, 310d and a plurality of second EDC data 306c, 308c, 310c. While the code word segments are programmed to the die 322, bit errors may accumulate in the code word segments. The one or more second EDC data 306c, 308c, 310c helps detect bit errors in the relevant segment of the code word 320b. For example, one or more bit errors 316a-316d have accumulated on the code word 320b, as indicated by the vertical dashed lines.

Though the code word 320b is illustrated to have four bit errors, more than or less than four bit errors may accumulate on a code word 320b. Furthermore, the bit errors may be randomly accumulated within each segment of each code word or randomly accumulated within code word. For example, the code word 320b illustrates that the bit errors 316 may be accumulated within the die ECC code (second ECC data 306d, 308d, 310d) and the die EDC code (second EDC data 306c, 308c, 310c). Though the bit errors 316 are not shown in the code word 320b for the data segment pt2 308b-308d and the data segment pt3 310b-310d for simplification purposes, one or more bit errors 316 may have accumulated within each of pt2 308b-308d and pt3 310b-310d. When the number of bit errors 316 in each segment, pt1 306b-306d, pt2 308b-308d, pt3 310b-310d, is less than a threshold number of bit errors, such as about 3 bit errors, the die ECC engine 312 may correct the errors within the segment using the second ECC data 306d, 308d, 310d and/or the second EDC data 306c, 308c, 310c. The threshold number of bit errors listed is not intended to be limiting, but to provide an example of a possible embodiment.

In the data segment pt1 306b-306d, four bit errors are illustrated. In one embodiment, the total number of bit errors in pt1 306b-306d may have been greater than four, such as seven bit errors. Different ECC data choices may be able to correct more or fewer bits in error, and some ECC data choices may be able to correct various numbers of bits in error dependent on their dispersion and the particular properties of the ECC algorithm implemented. Thus, some ECC engines utilized may be able to correct only 3 bits of error in some configurations, but may be able to correct 7 bits in error for other code words and error correlations. The correction capabilities described herein as a single number of bits in error is purely illustrative on quantifying some boundary of correction capability for any given ECC algorithm and implementation, and is not intended to be limiting.

When the number of bit errors exceeds the correction capability for any given die level ECC algorithm and implementation, the die ECC is unable to correct any of the bit errors. In certain implementations, the controller ECC may be subject to the same limitations. Because the die ECC engine 312 cannot correct all of the bit errors in pt1 306b-306d due to the amount of bit errors exceeding the threshold number, the code word 320b is sent back to the controller ECC engine, such as the first ECC engine 206 of FIG. 2. The controller ECC engine uses the first EDC data 336 to locate the bit errors 316 in the code word 320b and uses the first ECC data 338 to correct the located bit errors 316 in the code word 320b. The first ECC data 338 is able to correct more bit errors than the second ECC data 306d, 308d, 310d; however, the first ECC data process (i.e., fixing bit errors above the threshold number) may take longer than the second ECC data process (i.e., fixing bit errors below the threshold number).

Figure 4:
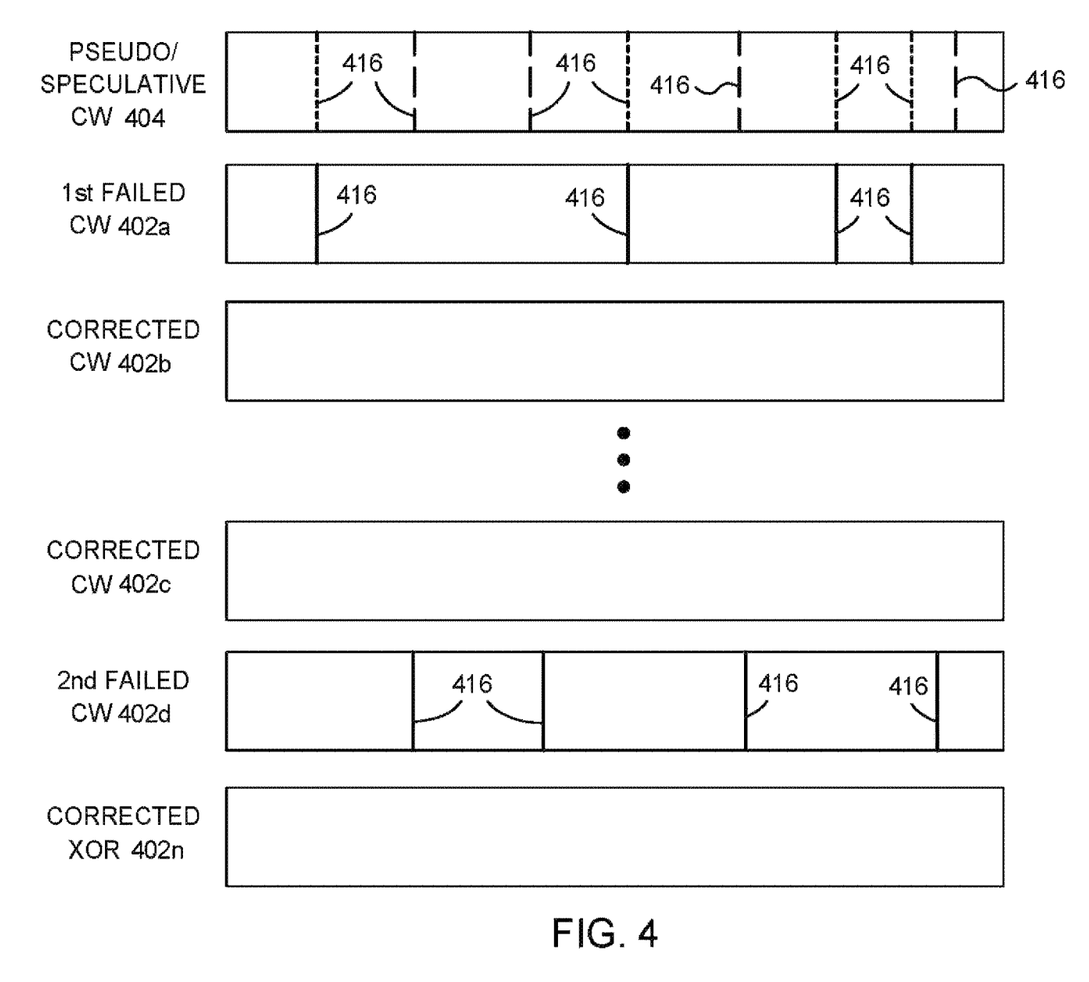
FIG. 4 is a diagram illustrating various code words, according to one embodiment.

FIG. 4 is a diagram illustrating various code words from a plurality of die ECC engines, according to one embodiment. The controller may be the controller 108 of FIG. 1 or the controller 204 of FIG. 2. Reference may be made to elements of FIGS. 2-3 for description purposes. The controller 204 receives a set of code words 402a-402n, 404 from various die ECC engines 218, 238, 258. While six code words are shown, a greater or lesser number of code words may be received by the controller 204 and/or the controller ECC engine 206, such as one code word from each storage block 220a-220n of a die 202a or one code word from each die 202a-202n.

As used herein, a correctable code word is a code word that has less than the threshold amount of bit errors than an ECC engine can correct. A corrected code word is a code word that has been corrected by an ECC engine. A perfected code word is a code word that has been successfully re-encoded after being corrected. For example, the perfected code word includes corrected data, corrected ECC data, and corrected EDC data, where the perfected code word may have no bits of error.

The set of code words 402a-402n comprises one or more uncorrected or failed code words, such as a first failed code word 402a and a second failed code word 402d, corrected XOR code word 402n, and plurality of corrected code words 402b-402c. The corrected XOR code word 402n and the plurality of corrected code words 402b-402c do not contain any bit errors due to the die ECC engine 312 correcting the errors using either XOR (parity) error correction or second ECC and/or EDC data. In other words, the corrected code words 402b, 402c, 402n comprised a number of bit errors less than the threshold number such that the die ECC engine 312 was able to perfect and correct the code words 402b, 402c, 402n. In one embodiment, the corrected code words 402a, 402c, 402n may have a minimal number of bit errors, such as about 3 bit errors, and be considered acceptable (i.e., does not need to be fixed). The minimal number of bit errors listed is not intended to be limiting, but to provide an example of a possible embodiment. Moreover, in some embodiments, the XOR code word may be a failed code word.

The controller ECC engine 206 first attempts to correct the first failed code word 402a using the corrected code words 402b-402c received from the other die ECC engines. If the controller ECC engine 206 is unable to correct the first failed code word 402a, the controller ECC engine 206 then generates a pseudo/speculative code word 404 from the set of code words 402a-402n by combining all the bit errors 416 of the two uncorrected or failed code words 404a, 404d into a new code word (i.e., pseudo/speculative code word 404). However, the controller ECC engine 206 does not know the originating location (i.e., code word) of each bit error 416 of the pseudo/speculative code word 404. The controller ECC engine 206 uses the first EDC data to detect the location of the bit errors 416 over the entire pseudo/speculative code word 404, and uses the first ECC data to correct the bit errors. The controller ECC engine 206 then uses the pseudo/speculative code word 404 to correct the bit errors in the two failed code words 402a, 402d.

Figure 5:
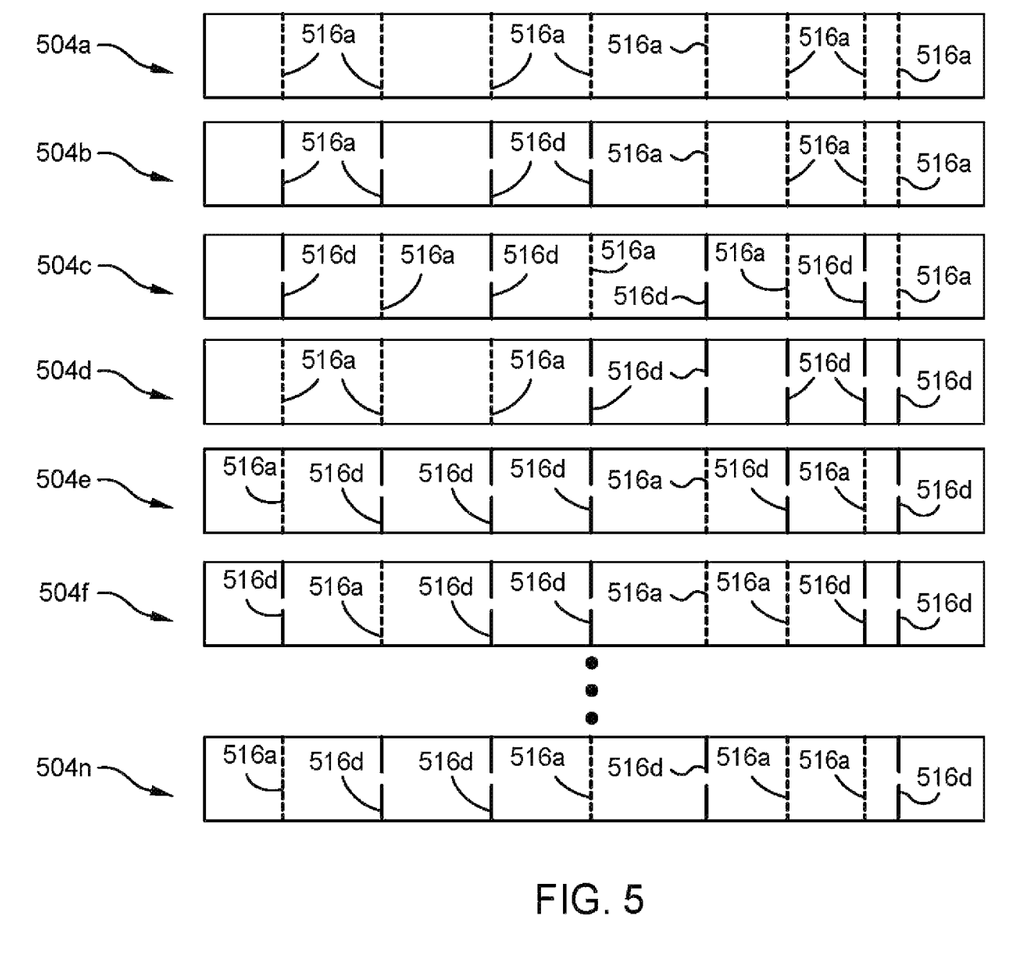
FIG. 5 is a diagram illustrating various bit error combinations in a pseudo/speculative code word, according to another embodiment.

FIG. 5 is a diagram illustrating various bit error combinations within a pseudo/speculative code word, according to another embodiment. The controller may be the controller 108 of FIG. 1 or the controller 204 of FIG. 2. Reference may be made to elements of FIGS. 2-4 for description purposes. The bit errors 516a, 516d (collectively referred to as bit errors 516) shown in each pseudo/speculative code word 504a-504n (collectively referred to as pseudo/speculative code word 504) are the same bit errors 416 shown in the pseudo/speculative code word 404 of FIG. 4 in various combinations to determine whether each bit error 516 came from the first failed code word 402a (bit errors 516a) or the second failed code word 402d (bit errors 516d).

In order to determine which bit error 516 is relevant to an individual failed code word 402a, 402d in the pseudo/speculative code word 504, the controller ECC engine 206 attempts different iterations or combination of bit errors 516 to match the bit errors 516 to their respective failed code word 402a, 402d. The different iterations may utilize one bit error, two bit errors, three bit errors, and so-forth. In some embodiments, every bit error is iterated such that for four bit errors, there are $(4!/1!*(4-1))+(4!/2!*(4-2))+(4!/3!*(4-3))+1=101$ unique combinations. For example, code word 504a is a first iteration or combination of bit errors 516, 504b is a second iteration or combination of bit errors 516, and so-forth, where 504n is the nth iteration or combination of bit errors 516 of the controller ECC engine 206 attempting to determine which bit errors 516a correspond to the first failed code word 402a and which bit errors 516d correspond to the second failed code word 402d. For example, the bit errors 516a of the first failed code word 402a of FIG. 4 and the bit errors 516d of the second failed code word 402d of FIG. 4, match the bit errors of code word 504n, where the dotted line represents the bit errors 516a that match the first failed code word 402a and the dashed line represent the bit errors 516d that match the second failed code word 402d. Unlike the die ECC engine 218, where the die ECC engine 218 corrects over a segment of a code word, the controller ECC engine 206 corrects over the entire code word.

The controller ECC engine 206 generates the different bit error 516 combinations within the pseudo/speculative code word 504 and uses the decoder 212 and first EDC data to determine whether the bit errors 516 have been corrected within the first failed code word 402a and/or the second failed code word 402d. The controller ECC engine 206 is able to rapidly generate various bit error combinations within the pseudo/speculative code word 504. For example, with 7 bits of difference between two failing code words, a controller may copy one of the failing code words $2^7$ minus two (i.e., $2^7-2$) times in a local SRAM. The controller may iterate through each of the SRAM locations to generate all potential speculative keywords. If implemented in a highly parallel controller hardware (HW) engine, the generation of all potential speculative code words could be done in a single clock cycle of the controller's HW engine. However, if done in controller firmware, and/or if done in a space constrained implementation with fewer than $2^7-2$ SRAM locations, then the generation of all potential speculative code words may consume up to tens of microseconds per generated speculative code word. The generation of speculative code words may be done prior to initiating any speculative corrections, or it may be done in an as needed basis.

Once the bit errors 516*a* of the first failed code word 402*a* (or the bit errors 516*d* of the second failed code words 402*d*) are accurately determined or corrected, the controller ECC engine 206 perfects the first failed code word 402*a*, or vice versa. The controller ECC engine 206 may then use the corrected first failed code word 402*a* and the XOR code word 402*n* to correct the bit errors 516*d* of the second failed code word 402*d*.

Figure 6:
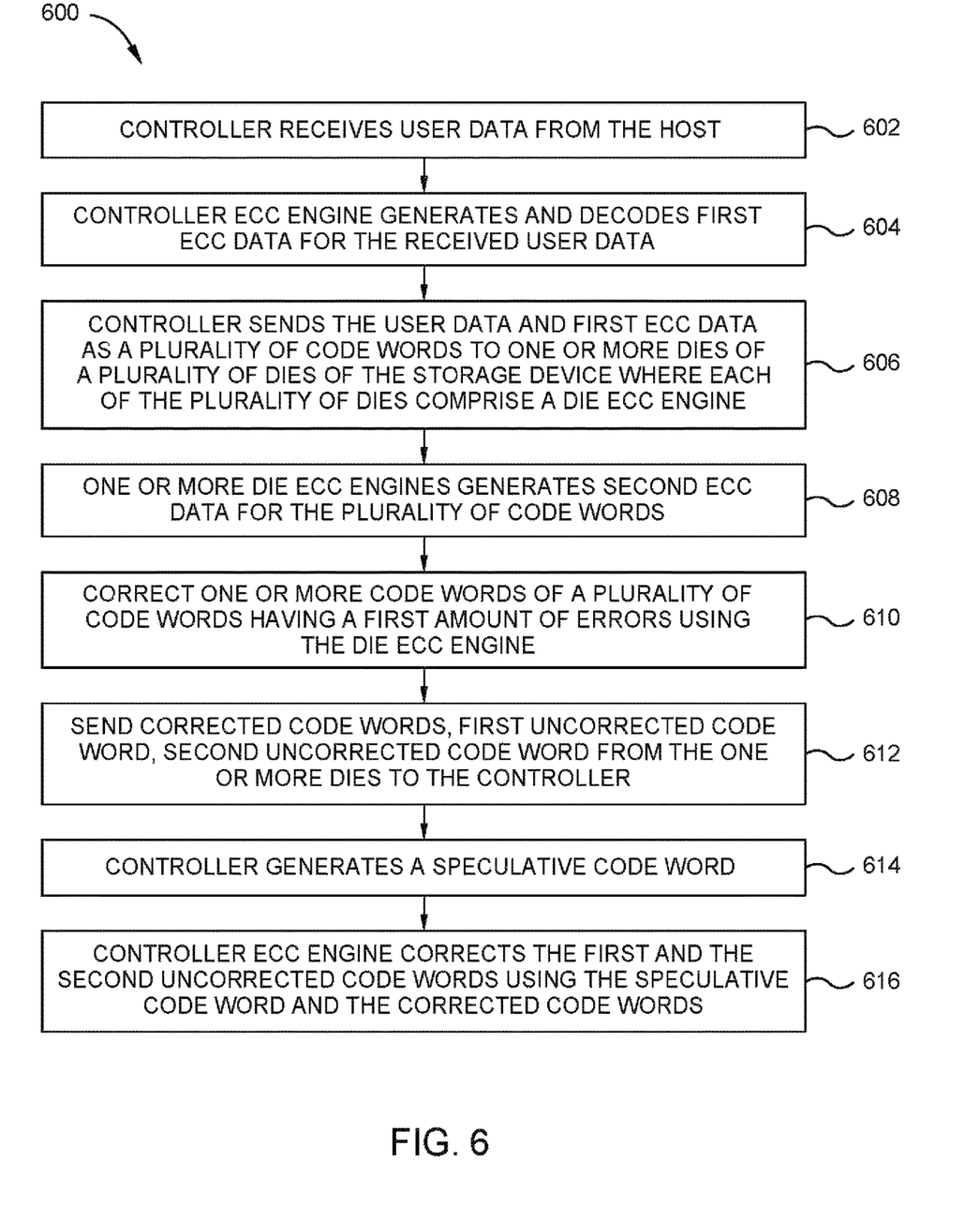
FIG. 6 is a flowchart illustrating the process of correcting erroneous code words, according to one embodiment.

FIG. 6 is a flowchart illustrating the process or method 600 of correcting erroneous code words, according to one embodiment. The controller may be the controller 108 of FIG. 1 or the controller 204 of FIG. 2. Reference may be made to elements of FIGS. 2-4 for description purposes. While three die ECC engines 218, 238, 258 are referred to in the method 600 below, more than three die ECC engines and dies may be utilized, and the number of die and die ECC engines is not intended to be limiting.

At block 602, the controller 204 receives user data from the host, such as the host 104. The user data that the controller receives initially passes through a host EDC engine (optional EDC implementation) to generate protection information data (host EDC data) for the user data. At block 604, the controller ECC engine 206 decodes the user data and the host EDC data and generates the first ECC data and the first EDC data for the received user data. The controller 204 then sends the user data, the first ECC data, and the first EDC data as a plurality of code words to one or more dies of a plurality of dies 202*a*-202*n* of the storage device at block 606. The plurality of dies 202*a*-202*n* each comprise a die ECC engine 218, 238, 258, where, at block 608 the die ECC engine 218 of the die(s) 202*a* that received the one or more code words generates second ECC data and second EDC data for a plurality of sections for each of the plurality of code words. The die ECC engine may be the die ECC engine 312 of FIG. 3. The second ECC data and the second EDC data for the plurality of sections for each of the plurality of code words are then written to the dies along with the user or host data, such as the dies containing the user data or a different die that does not contain user data. The data may then sit in rest for a period of time until a read command or request is received.

At block 610, when a read request is received from the host to read the user or host data, the die ECC engines 218, 238, 258 use the second EDC data to detect bit errors in each segment of the code word, and use the second ECC data to correct the bit errors found in each segment of the code word. The number of bit errors that the second ECC data of a code word segment may be used to correct may be a maximum of about three bit errors, for example, before indicating to one or more of the die ECC engines 218, 238, 258 that the second ECC data for a particular code word segment has failed. At block 610, each die ECC engine 218, 238, 258 determines whether the amount of errors within a code word can be corrected or perfected.

If one or more of the die ECC engines 218, 238, 258 determines the amount of errors is under the threshold amount, and thus are correctable, a first amount of errors in each code word segment is corrected by the corresponding die ECC engine 218, 238, 258 (i.e., the number of bit errors is less than the threshold amount of bit errors that the die ECC engines may correct). The first amount of errors may be limited by the capabilities of the die ECC engines 218, 238, 258. For example, the limit may be a threshold value of about 3 bit errors, such that each die ECC engine 218, 238, 258 may correct up to about 3 bit errors in each section before indicating to the controller 204 that the die ECC engines 218, 238, 258 failed to correct one code word. The parity information may be able to correct the one failed code word.

However, at block 612, if one or more die ECC engines 218, 238, 258 are unsuccessful in correcting the errors within one or more code words, such as two code words failing (i.e., two code words comprise a number of errors greater than the threshold value that the die ECC engine 218 can correct), the die ECC engines 218, 238, 258 storing the failed code words sends the two failed code words to the controller ECC engine 206 for correction along with the corrected code words. Thus, the corrected code words, the first uncorrected code word (i.e., first failed code word), and the second uncorrected code word (i.e., second failed code word) are sent from their respective die 202*a*-202*n* locations to the controller ECC engine, like described above. The controller 204 (e.g., the controller ECC engine 206) attempts to correct at least one of the failed code words using the corrected code words. If the controller 204 is unable to correct the failed code words(s), the controller 204 and/or controller ECC engine 206 generates a pseudo/speculative code word, such as pseudo/speculative code word 404 of FIG. 4, by combining the bit errors from each of the code words copied from the one or more dies to the controller 204 at block 614.

At block 616, the controller ECC engine 206 corrects the first uncorrected code word and the second uncorrected code word using the pseudo/speculative code word and the corrected code words, where the controller ECC engine 206 determines which bit errors correspond to which failed code word through an iterative process of testing combinations or variations of the bit errors, such as described in FIG. 5. After determining which bit errors correspond to which failed code word, the controller ECC engine 206 corrects a second amount of errors (i.e., a number of errors above the threshold value correctable by the die ECC engine 218) of the failed code words to an acceptable value, such as less than about 2 bit errors. The listed acceptable value is not intended to be limiting, but to provide an example of a possible embodiment. In one embodiment, the second amount of errors (e.g., a number or errors correctable by the controller ECC engine 206) is greater than the first amount of errors (i.e., a number of errors correctable by the die ECC engine 218). In another embodiment, the second amount of errors is less than the first amount of errors.

Furthermore, in some embodiments, the controller may send the pseudo/speculative code word to one or more die ECC engines 218, 238, 258. The die ECC engine(s) 218, 238, 258 may partition the code word into different parts once more, such as pt1 306*a*, pt2 308*a*, and pt3 310*a* of FIG. 3. The die ECC engine(s) 218, 238, 258 may then attempt to correct the bit errors in the individual parts within the capabilities of the die ECC engine(s) 218, 238, 258 (e.g., the number of bit errors in each individual part is less than the threshold number of bit errors that the die ECC can correct.

If the die ECC engine(s) 218, 238, 258 is successful at correcting the errors in one or more parts of the code word, the die ECC engine(s) 218, 238, 258 send the partially corrected code word back to the controller 204 and controller ECC engine 206 to finish being corrected, like in the manner described above (i.e., blocks 610-616 are repeated one or more times). Such embodiments may require an extra temporary space (e.g., RAM or NVM) where the data sent down to the die may be operated on. Alternatively, the controller 204 may emulate such a decoding process inside of the controller 204.

For example, when a read request is received by the controller to read data stored in the NVM, the die ECC engine(s) attempts to decode the code word. When one or more parts of the code word, such as pt1 306a, pt2 308a, and pt3 310a of FIG. 3, fail due to a number of errors present greater than the die ECC threshold value, each part of the code word (e.g., corrected and uncorrected) is transferred to the controller ECC engine. In one embodiment, when operating with systematic ECC, the optional information on which part of the code word failed is also transferred to the controller ECC engine, such as the separated ECC and EDC data.

After the failed code word is transferred to the controller ECC engine, the controller ECC engine decodes and attempts to correct the failed code word. The controller ECC engine may also use the optional information (i.e., information that includes which part of the code word failed) to try to correct the failed part(s) of the code word. If the controller ECC decode fails, the controller may utilize the XOR data to recover the code word across each of the dies. If one or more code words continue to fail after the XOR data is used (e.g., a second code word fails), then the controller may send the failed code words back to the die ECC engine(s). The raw data stored within each die contributing to the XOR data is read, including the raw data segment or part, corresponding raw EDC data, corresponding raw ECC data.

The die ECC engine(s) then encodes the parts of the correctable code words such that the correctable code words have zero bits of error, and these die code words may now be in a perfected code word state. The die ECC engine(s) utilizes the XOR data to XOR the corrected die code words with the uncorrectable die code word. The die ECC engine generates a pseudo/speculative code word utilizing the XOR code word and the uncorrectable code words. The controller ECC engine attempts to decode the pseudo/speculative code word in the controller, similar to as described in FIGS. 4-6 above but occurring within the die ECC engine(s). Alternatively, the die ECC engine(s) may attempt to decode the one or more parts of the pseudo/speculative code word within a temporary location in the NVM of a die.

In one embodiment, if the one or more code words continue to fail after the XOR data is used (e.g., a second code word fails), then the full data stored within each die may be read, including the host or user data, corresponding die EDC data, corresponding die ECC data, and the corresponding code word parts. The die ECC engine(s) then corrects or encodes the parts of the die code words that have zero bits of error and the corresponding die EDC and ECC data. The controller ECC engine continues to store the controller level ECC and EDC data for the failed code words, as well as for the corrected code words. Thus, the controller and/or die ECC engine(s) knows the two failed die code words and corresponding die EDC and die ECC data for each, the corresponding controller EDC and ECC data for each of the two failed code words, and the corrected code words and corresponding die and controller EDC and ECC data. The controller is then able to determine if the two failed parts of the failed code words are in the same position within each of the failed or uncorrected code words. If the two failed parts of the failed code words are not in the same respective die level code words (labeled pt1 306a, pt2 308a, and pt3 310a in FIG. 3, for example), then the controller may combine the corrected portions of the die code words for a fully correctable controller level code word.

If the two die level code words are in the same respective position (for example, both controller level code words that are failing in the XOR stripe or data are failing on their sub die level pt1 segments), then the method described in FIG. 5 can be implemented at the die level. Failing original code word part pt1 and the code word part pt1 that is the result of an XOR of all of the controller level encoding and decoding will have differences where both parts have accumulated bits of error. For each difference(s) in these two code words, a speculative code word may be generated. Each speculative code word is then put into a die level temporary buffer (e.g., NVM or RAM). The die level decode process is attempted on the die level speculative code word with a return of the status to the controller. Upon successful correction of a die level code word on one of the speculative code words, the method or process will exit with successful return of the data. In another embodiment, the temporary buffer in the die and the decoding of the die level code word may be performed in the controller.

The die ECC engine generates additional ECC and EDC data for each segment of the code word of the user data written to each die. The die ECC data (i.e., second ECC data) is used to correct up to a threshold value of errors. Because the die ECC engine corrects each code word segment on a granular scale, the error correction operation may be quicker and utilize a minimal amount of processing power, when compared to the error correction operation of the controller ECC engine. Moreover, while conventional storage drives are only able to correct one failed code word, utilizing both a controller ECC engine and a plurality of die ECC engines allows the above-described storage device to correct two code words. As such, more bit errors can be tolerated and corrected, reducing or preventing data loss.

In one embodiment, a storage unit comprising a controller coupled to the media unit. The controller comprises a controller ECC engine, wherein the controller ECC engine is configured to generate first ECC data for user data. The storage unit further comprises a media unit comprising a plurality of dies. Each of the dies comprises a die ECC engine, wherein each of the dies are configured to receive and store the user data and the first ECC data from the controller, and wherein each of the die ECC engines are individually configured to generate second ECC data for the user data.

The controller ECC engine comprises a parity engine, a decode engine, and an encode engine. The controller ECC engine is further configured to generate first EDC data for the user data. Each of the die ECC engines are configured to generate second EDC data for the user data. The storage device further comprises a protection information engine configured to generate protection information for the user data. The controller ECC engine is configured to send the user data and the first ECC data as a plurality of code words to the plurality of dies. Each die ECC engine of the plurality of dies is configured to correct one or more code words of the plurality of code words. Each die ECC engine of the plurality of dies is configured to generate a speculative code word for two or more uncorrected code words of the plurality of code words. Each die ECC engine of the plurality of dies is configured to correct the two or more uncorrected code words using the speculative code word and the corrected code words. The media unit comprises magnetoresistive random access memory (MRAM).

The controller ECC engine is configured to send the user data and the first ECC data as a plurality of code words to the plurality of dies. Each die ECC engine of the plurality of dies is configured to correct one or more code words of the plurality of code words. Each die ECC engine of the plurality of dies is configured to send the one or more corrected code words to the controller ECC engine. The controller ECC engine is configured to generate a speculative code word for two or more uncorrected code words of the plurality of code words. The controller ECC engine is configured to correct the two or more uncorrected code words using the speculative code word and the corrected code words. The controller is configured to receive one or more commands to write the user data, and temporarily store the user data in the RAM until the user data aggregates to a minimum write size.

In another embodiment, a storage device comprising a controller coupled to the media unit. The controller comprises a controller ECC engine, wherein the controller ECC engine is configured to generate first ECC and EDC data for user data and correct a first amount of errors within the user data. The storage device further comprises a media unit comprising a plurality of dies. Each of the dies comprises a die ECC engine, wherein each of the die ECC engines are individually configured to receive the first ECC and EDC data and the user data from the controller as one or more code words, generate second ECC and EDC data for the one or more code words, store the second ECC and EDC data and the one or more code words, and correct a second amount of errors within the user data, where the second amount of errors being less than the first amount of errors.

The controller further comprises an internal random access memory (RAM), and wherein the controller ECC engine comprises a parity engine, a decode engine, and an encode engine. The media unit comprises magnetoresistive random access memory (MRAM), non-volatile memory, or volatile memory. The one or more code words are a plurality of code words. The die ECC engines are further configured to send one or more corrected code words of the plurality of code words and one or more uncorrected code words of the plurality of code words to the controller, the one or more uncorrected code words having the first amount of errors. The controller ECC engine is further configured to correct the one or more uncorrected code words received from the die ECC engines. The controller ECC engine is configured to correct the one or more uncorrected code words by generating a speculative code word.

In another embodiment, a method of operating a storage device comprises receiving, at a controller of the storage device, user data, generating first ECC data for the user data in a controller ECC of the controller, and sending the user data and the first ECC data as a plurality of code words to one or more dies of a plurality of dies of the storage device, where each of the plurality of the dies comprises a die ECC engine. The method of operating a storage device further comprises generating, in the die ECC engines of the one or more dies, second ECC data for the plurality of code words, correcting one or more code words of the plurality of code words having a first amount of errors using the die ECC engine of the first die to form one or more corrected code words free of errors, and sending the corrected code words, a first uncorrected code word, a second uncorrected code word, and the second ECC data from the one or more dies to the controller, where the first and second uncorrected code words have a second amount of errors. The method of operating a storage device also comprises generating a speculative code word and correcting the first and second uncorrected code words using the speculative code word and the corrected code words.

The speculative code word comprises the errors from both the first uncorrected code word and the second uncorrected code word. Correcting the first and second uncorrected code words using the speculative code word and the corrected code words comprises generating a plurality of bit error combinations within the speculative code word. Generating the first ECC data for the user data in the controller ECC engine comprises generating first EDC data and parity data for the user data. Generating second ECC data for the plurality of code words comprises generating second EDC data. The method further comprises sending the corrected code words, the first uncorrected code word, the second uncorrected code word, and the first ECC data from the controller to the one or more dies prior to generating the speculative code word, wherein the speculative code word is generated in the die ECC engines of the one or more dies. The speculative code word is generated in the controller ECC engine. The speculative code word is generated in the die ECC engines of the one or more dies, and wherein the first and second uncorrected code words are corrected in the die ECC engines.

While the foregoing is directed to embodiments of the present disclosure, other and further embodiments of the disclosure may be devised without departing from the basic scope thereof, and the scope thereof is determined by the claims that follow.

What is claimed is:

1. A storage device, comprising:
   a controller comprising a controller error correction code (ECC) engine, wherein the controller ECC engine is configured to generate first ECC data for user data; and
   a media unit comprising a plurality of dies coupled to the controller, each of the dies comprising a die ECC engine, wherein:
      each of the dies are configured to receive and store the user data and the first ECC data from the controller,
      each of the die ECC engines are individually configured to generate second ECC data for the user data,
      each of the die ECC engines is configured to correct one or more code words of a plurality of code words, and
      each of the die ECC engines is configured to generate a speculative code word for two or more uncorrected code words of the plurality of code words.

2. The storage device of claim 1, wherein the controller ECC engine comprises a parity engine, a decode engine, and an encode engine.

3. The storage device of claim 1, wherein the controller ECC engine is further configured to generate first error detection code (EDC) data for the user data.

4. The storage device of claim 1, wherein each of the die ECC engines are configured to generate second EDC data for the user data.

5. The storage device of claim 1, wherein the controller ECC engine is configured to send the user data and the first ECC data as the plurality of code words to the plurality of dies; and
   wherein each die ECC engine of the plurality of dies is configured to correct the two or more uncorrected code words using the speculative code word and the corrected code words.

6. The storage device of claim 1, wherein the media unit comprises magnetoresistive random access memory (MRAM).

7. The storage device of claim 1, wherein the controller ECC engine is configured to send the user data and the first ECC data as the plurality of code words to the plurality of dies;
   wherein each die ECC engine of the plurality of dies is configured to send the one or more corrected code words to the controller ECC engine; and
   wherein the controller ECC engine is configured to correct the two or more uncorrected code words using the speculative code word and the corrected code words.

8. The storage device of claim 1, wherein the controller is configured to receive one or more commands to write the user data, and temporarily store the user data in the random access memory (RAM) until the user data aggregates to a minimum write size.

9. A storage device, comprising:
   a controller comprising a controller error correction code (ECC) engine, wherein the controller ECC engine is configured to:
      generate first ECC and error detection code (EDC) data for user data; and
      correct a first amount of errors within the user data;
   a media unit comprising a plurality of dies coupled to the controller, each of the dies comprising a die ECC engine, wherein each of the die ECC engines are individually configured to:
      receive the first ECC and ECD data and the user data from the controller as one or more code words;
      generate second ECC and EDC data for the one or more code words;
      store the second ECC and EDC data and the one or more code words;
      correct a second amount of errors within the user data, the second amount of errors being less than the first amount of errors; and
      send one or more corrected code words of the one or more code words and one or more uncorrected code words of the one or more code words to the controller, wherein the controller ECC engine is further configured to correct the one or more uncorrected code words received from the die ECC engines by generating a speculative code word.

10. The storage device of claim 9, wherein the controller further comprises an internal random access memory (RAM), and wherein the controller ECC engine comprises a parity engine, a decode engine, and an encode engine.

11. The storage device of claim 9, wherein the media unit comprises magnetoresistive random access memory (MRAM), non-volatile memory, or volatile memory.

12. The storage device of claim 9, wherein the one or more code words are a plurality of code words, and wherein the one or more uncorrected code words have the first amount of errors.

13. A method of operating a storage device, comprising:
   receiving, at a controller of the storage device, user data;
   generating first error correction code (ECC) data for the user data in a controller ECC engine of the controller;
   sending the user data and the first ECC data as a plurality of code words to one or more dies of a plurality of dies of the storage device, each of the plurality of dies comprising a die ECC engine;
   generating, in the die ECC engines of the one or more dies, second ECC data for the plurality of code words;
   correcting one or more code words of the plurality of code words having a first amount of errors using the die ECC engine of the first die to form one or more corrected code words free of errors;
   sending the corrected code words, a first uncorrected code word, a second uncorrected code word, and the second ECC data from the one or more dies to the controller, the first and second uncorrected code words having a second amount of errors;
   generating a speculative code word; and
   correcting the first and second uncorrected code words using the speculative code word and the corrected code words.

14. The method of claim 13, wherein the speculative code word comprises the errors from both the first uncorrected code word and the second uncorrected code word.

15. The method of claim 13, wherein correcting the first and second uncorrected code words using the speculative code word and the corrected code words comprises generating a plurality of bit error combinations within the speculative code word.

16. The method of claim 13, wherein generating the first ECC data for the user data in the controller ECC engine comprises generating first error detection code (EDC) data and parity data for the user data, and wherein generating second ECC data for the plurality of code words comprises generating second EDC data.

17. The method of claim 13, further comprising sending the corrected code words, the first uncorrected code word, the second uncorrected code word, and the first ECC data from the controller to the die ECC engines of the one or more dies prior to generating the speculative code word, wherein the speculative code word is generated in the die ECC engines of the one or more dies, and wherein the first and second uncorrected code words are corrected in the die ECC engines.

18. The method of claim 13, wherein the speculative code word is generated in the controller ECC engine.

* * * * *